United States Patent [19]
Tamada et al.

[11] Patent Number: 5,868,560
[45] Date of Patent: Feb. 9, 1999

[54] RETICLE, PATTERN TRANSFERRED THEREBY, AND CORRECTION METHOD

[75] Inventors: Naohisa Tamada; Toshihide Kawachi; Yuki Miyamoto, all of Hyogo, Japan

[73] Assignee: Mitsubishi Denki Kabushiki Kaisha, Tokyo, Japan

[21] Appl. No.: 940,946

[22] Filed: Sep. 30, 1997

[30] Foreign Application Priority Data

Mar. 31, 1997 [JP] Japan ................................ 9-080411

[51] Int. Cl.⁶ .................................................. G03F 9/00
[52] U.S. Cl. .................................................. 430/5; 430/22
[58] Field of Search ........................... 430/5, 22, 322; 356/401

Primary Examiner—S. Rosasco
Attorney, Agent, or Firm—McDermott, Will & Emery

[57] ABSTRACT

A reticle that allows deviation in rotation and magnification of an exposure region detected just using a wafer subjected to exposure and development without having to provide an underlying pattern, a pattern transferred using such a reticle, and a correction method are achieved. A first measurement pattern is provided on a dicing line pattern of the X axis direction. Also, a second measurement pattern is formed on a line of extension of the first measurement pattern in the Y axis direction. Similarly, a third measurement pattern is formed on the dicing line pattern in the Y axis direction. A fourth measurement pattern is provided corresponding to the third measurement pattern.

13 Claims, 9 Drawing Sheets

RETICLE, PATTERN TRANSFERRED THEREBY, AND CORRECTION METHOD

BACKGROUND OF THE INVENTION

1. Field of the Invention

The present invention relates to a reticle, a pattern transferred by a reticle, and a correction method. More particularly, the present invention relates to a reticle, a pattern transferred by a reticle, and a correction method employed in an exposure process for a semiconductor wafer.

2. Description of the Background Art

An exposure process is conventionally known as one manufacturing step for ICs and LSIs. In this exposure process, deviation in the rotation of an exposure region (chip rotation) and deviation in the magnification of an exposure region (chip magnification) are encountered originating from the semiconductor wafer and exposure device (stepper).

Detection of such chip rotation and chip magnification is conventionally carried out as set forth in the following. An underlying pattern formed in advance is exposed and developed. A further measurement pattern is formed above that underlying pattern. The amount of deviation between that measurement pattern and the underlying pattern is gauged. However, it was difficult to gauge the chip rotation and the chip magnification in the first exposure step (first step) where there is no underlying pattern on the wafer according to conventional art. There was a need for a measurement pattern that allows gauging of the chip rotation and chip magnification with only a wafer subjected to exposure and development without requiring an underlying pattern.

In the past years, the demand for overlay accuracy is critical. It is now necessary to correct the exposure condition after gauging deviation in chip rotation and chip magnification for one wafer in one lot to eliminate variation in the exposure condition for the first step for other wafers in the same lot. It has also become necessary to render uniform the exposure condition of the first step between a plurality of steppers. When the first step is carried out using a plurality of steppers, there will be a mixture of semiconductor wafers subjected to the first step of exposure with the plurality of steppers at the steps subsequent to the first step. In order to improve the overlay accuracy between each step, the plurality of steppers must have the exposure condition of the first step set equal. In order to meet these requirements, variation in chip rotation and variation in chip magnification must be calculated independently for each stepper to correct the exposure condition of each stepper according to the calculated result.

FIGS. 12 and 13 are plan views showing a conventional measurement pattern (fiducial mark). This fiducial mark is disclosed in Japanese Patent Laying-Open No. 6-324475. More specifically, FIG. 12 is a plan view showing a conventionally proposed reticle, and FIG. 13 is a plan view showing a fiducial mark formed on a wafer using the reticle of FIG. 12.

Referring to FIG. 12, circuit pattern region 25 of a rectangular configuration is formed at a predetermined region of a transparent substrate 22 by the conventional reticle. A wafer alignment mark 26 is formed in an outer perimeter area of circuit pattern region 25. Also, respective fiducial marks 27 are formed at the four corners outer of circuit pattern region 25. A light blocking region 24 is formed so as to surround respective fiducial mark 27. Four reticle alignment marks 23 are formed at the outer side of light blocking region 24.

By transferring the pattern of the used reticle of FIG. 12 on a wafer, a fiducial mark as shown in FIG. 13 is obtained. The fiducial mark of FIG. 13 shows a specific plane configuration of fiducial mark 27 shown in FIG. 12. Referring to FIG. 13, the fiducial mark formed on the wafer includes a first fiducial mark 28 and a second fiducial mark 29. First fiducial mark 28 includes a projection portion 30. Second fiducial mark 29 includes a projection portion 31. The pitch of each projection of projection portion 30 is set slightly offset the pitch of the projection of projection portion 31.

In operation, exposure is carried out using the conventional reticle shown in FIG. 12. After a development process, first fiducial mark 28 and second fiducial mark 29 shown in FIG. 13 are formed on an exposure region on a wafer. The amount of deviation is gauged by obtaining the difference between distances a and b between projection portion 30 of first fiducial mark 28 and projection portion 31 of second fiducial mark 29.

However, the specific method of detecting the deviation and correction method thereof according to the conventional fiducial marks shown in FIGS. 12 and 13 are not disclosed in Japanese Patent Laying-Open No. 6-324475. The procedure of calculating deviation in chip rotation and chip magnification independently to carry out correction is also not disclosed. It was therefore difficult to employ the conventional art shown in FIGS. 12 and 13 for correcting the chip rotation and chip magnification at the time of exposure with a stepper.

The fiducial mark shown in FIG. 13 induces the possibility of deformation in the fiducial mark when there is aberration. It was difficult to carry out accurate gauging in such a case. According to the first and second fiducial marks 28 and 29 of FIG. 13, there may be a case where the influence from aberration differs between the fiducial mark and the circuit pattern region depending upon the pattern type of the circuit pattern region. In such a case, usage of the fiducial mark of FIG. 13 as measurement means for alleviating the influence of aberration upon the circuit pattern region is inappropriate.

Furthermore, the fiducial mark shown in FIG. 13 has the disadvantage that a larger occupying area is required since first and second fiducial marks 28 and 29 do not completely overlap each other. There was a problem that the exposure region of the stepper cannot be used effectively.

According to the conventional fiducial mark shown in FIG. 13, second fiducial mark 29 is formed above first fiducial mark 28 previously formed as an underlying pattern to detect the deviation between the first and second fiducial marks 28 and 29. Therefore, there was a problem that it was difficult to use such conventional marks when exposure is to be carried out at the first step.

SUMMARY OF THE INVENTION

An object of the present invention is to provide a reticle including a measurement pattern from which gauging can be achieved just with a wafer subjected to exposure and development without an underlying pattern, and a pattern transferred by such a reticle.

Another object of the present invention is to provide a reticle that allows correction at high accuracy by setting influence of aberration substantially equal between a chip region and a fiducial mark region, and a pattern transferred by such a reticle.

A further object of the present invention is to provide a reticle including a measurement pattern that allows occupying area to be reduced, and a pattern transferred by such a reticle.

Still another object of the present invention is to provide a method of correcting overlapping deviation that also chip rotation, chip magnification, and chip orthogonality to be calculated independently.

According to an aspect of the present invention, a reticle used in an exposure process of a semiconductor wafer includes a transparent substrate with a main surface, a chip pattern, a dicing line pattern, a first measurement pattern, a second measurement pattern, a third measurement pattern and a fourth measurement pattern. The chip pattern is formed on the main surface of the transparent substrate. The dicing line pattern is formed on the main surface of a transparent substrate along the outer perimeter of an X axis direction of the chip pattern and the Y axis direction of the chip pattern. At least one first measurement pattern is formed on the dicing pattern in the X axis direction. The second measurement pattern is formed on a line of extension of the first measurement pattern in the Y axis direction so as to sandwich the chip pattern with the first measurement pattern. At least one third measurement pattern is formed on the dicing line pattern in the Y axis direction. The fourth measurement pattern is formed on a line of extension of the third measurement pattern in the X axis direction so as to sandwich the chip pattern with the third measurement pattern. The distance between the outer perimeter of the dicing line pattern in X axis direction to the center of gravity of the first measurement pattern is substantially equal to the distance from the outer perimeter of the chip pattern in the X axis direction to the center of gravity of the second measurement pattern. The distance from the outer perimeter of the dicing line pattern in the Y axis direction to the center of gravity of the third measurement pattern in the X axis direction is substantially equal to the distance from the outer perimeter of the chip pattern in the Y axis direction to the center of gravity of the fourth measurement pattern in the X axis direction. By providing first, second, third and fourth measurement patterns in the reticle of the present aspect, first and second measurement patterns are formed overlapping each other on the dicing line pattern in the X axis direction and the third and fourth measurement patterns are formed on the dicing line pattern in the Y axis direction when a pattern is transferred on a wafer using this reticle. By gauging the amount of deviation between the transferred first measurement pattern and the second measurement pattern, and the amount of deviation between the transferred third measurement pattern and the fourth measurement pattern, deviation in chip magnification and chip rotation can be readily calculated without having to provide an underlying pattern. The measurement pattern of the present invention can be applied to the first exposure process (first step) since it is possible to detect deviation in the overlay with only one pattern subjected to exposure and development and without having to provide an underlying pattern. Therefore, the exposure condition of the first step can be set equal between a plurality of steppers when the exposure of the first step is carried out by a plurality of steppers. As a result, the overlay accuracy in the steps subsequent to the first step can be improved in comparison with that of conventional art. According to the reticle of the present aspect, the first and second measurement patterns completely overlap each other, and also the third and fourth measurement patterns completely overlap each other when the first to fourth measurement patterns are transferred. It is therefore possible to reduce the occupying area of the measurement pattern. Thus, the exposure regions of the stepper can be used effectively.

According to the reticle of the present aspect, the first, second, third and fourth measurement patterns are preferably formed to include a pattern of a type identical to that of the chip pattern. It is therefore possible to approximate the exposure and development characteristics of the first to fourth measurement patterns to those of the chip pattern. The effect of aberration on the measurement pattern can be approximated to the effect of aberration on the chip area to allow a more precise gauging in the overlay accuracy. More preferably, the first and second measurement patterns are formed so as to have substantially the same configuration, and so that one of the first and second measurement patterns is greater in size than the other. Also, the third and fourth measurement patterns are formed so as to have substantially the same configuration, and so that one of the third and fourth measurement patterns is formed greater in size than the other. Accordingly, the first and second measurement patterns can overlap each other completely, and the third and fourth measurement patterns can overlap each other completely when the measurement patterns are transferred on a wafer using this reticle. As a result, the area for the first to fourth measurement patterns serving as fiducial marks can be reduced in size in comparison to conventional art. Therefore, the exposure region of the stepper can be used effectively.

According to another aspect of the present invention, a pattern formed on a semiconductor wafer using a reticle includes a chip pattern, a dicing line pattern, a first measurement pattern, a second measurement pattern, a third measurement pattern and a fourth measurement pattern. The dicing line pattern is formed along the outer perimeter of the chip pattern in an X axis direction and an Y axis direction. At least one first measurement pattern is formed on the dicing line pattern in the X axis direction. The second measurement pattern is formed within the region of the first measurement pattern so as to overlap the first measurement pattern. The second measurement pattern is smaller than the first measurement pattern. At least one third measurement pattern is formed on the dicing line pattern in the Y axis direction. The fourth measurement pattern is smaller than the third measurement pattern, and is formed within a region of the third measurement pattern so as to overlap the third measurement pattern. According to the pattern of the present aspect, first and second measurement patterns are formed on the dicing line pattern in the X axis direction, and the third and fourth measurement patterns are formed on the dicing line pattern in the Y axis direction. By gauging the amount of deviation between the first measurement pattern and the second measurement pattern, and the amount of deviation between the third measurement pattern and the fourth measurement pattern, the amount of deviation in chip magnification and chip rotation can be easily calculated. As a result, the exposure condition of a stepper can easily be corrected using the calculated amount of deviation as a correction value. Since the first to fourth measurement patterns are formed in the same one layer, overlay deviation can be detected without having to provide an underlying pattern. It is therefore possible to gauge overlay deviation even in the first exposure process (first exposure step). The exposure condition between a plurality of steppers can be set uniform even when the first exposure step is carried out using a plurality of steppers. As a result, the overlay accuracy in the exposure step subsequent to the second exposure step can further be improved.

According to the pattern of the present aspect, the first, second, third and fourth measurement patterns are preferably formed to include a pattern of a type identical to that of the chip pattern. This allows the exposure and development characteristics of the first to fourth measurement patterns to approximate the exposure and development characteristics of the chip pattern of the chip region. This provides the advantage that the effect of aberration on the measurement pattern can be made to approximate the effect of aberration on the chip region. As a result, a more precise gauging in overlay deviation can be carried out. Preferably, first, second, third and fourth measurement patterns are formed in a concave configuration. Also, the first, second, third and fourth measurement patterns can be formed by a plurality of openings. Furthermore, the first, second, third and fourth measurement patterns can be formed in a convex configuration.

According to a further aspect of the present invention, a correction method using a reticle employs a reticle including a chip pattern, a dicing line pattern, and first, second, third and fourth measurement patterns. The chip pattern is formed on a main surface of a transparent substrate. The dicing line pattern is formed on the main surface of the transparent substrate along the outer perimeter of the chip pattern in an X axis direction and an Y axis direction. At least one first measurement pattern is formed on the dicing line pattern in the X axis direction. The second measurement pattern is formed on a line of extension of the first measurement pattern in the Y axis direction so as to sandwich the chip pattern with the first measurement pattern. At least one third measurement pattern is formed on the dicing line pattern in the Y axis direction. The fourth measurement pattern is formed on a line of extension of the third measurement pattern in the X axis direction so as to sandwich the chip pattern with the third measurement pattern. According to a correction method using such a reticle, the chip pattern, the dicing line pattern, and the first to fourth measurement pattern are transferred on a semiconductor wafer by carrying out exposure and development using the reticle. The amount of deviation between the transferred first and second measurement patterns, and the amount of deviation between transferred third and fourth measurement patterns are gauged using an overlay detection device. At least one of the amount of deviation in chip magnification and chip rotation is calculated according to the gauged amount of deviation. When the amount of deviation in chip magnification is calculated, that value is applied at a subsequent exposure process as a chip magnification correction value. When the amount of deviation in chip rotation is calculated, that value is applied at a subsequent exposure process as a chip rotation correction value. According to the present correction method, at least one of a chip magnification correction value and chip rotation correction value can be calculated by the first to fourth measurement patterns without having to provide an underlying pattern. Thus, the correction method can be applied even in the first exposure step. When the first exposure step is carried out by a plurality of steppers, the deviation in the chip magnification and chip rotation between the plurality of steppers can be corrected, whereby the exposure condition can be made more uniform.

According to the correction method of the present aspect, amount of deviation in orthogonality of the chip is preferably calculated according to the amount of deviation in chip rotation. The calculated value of chip orthogonality deviation is applied at a subsequent exposure step as a chip orthogonality deviation correction value. According to this implementation, the amount of deviation in chip rotation and chip orthogonality can both be fed back to the stepper simultaneously as a correction value, whereby the deviation in overlay can further be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

First Embodiment

Figure 1:
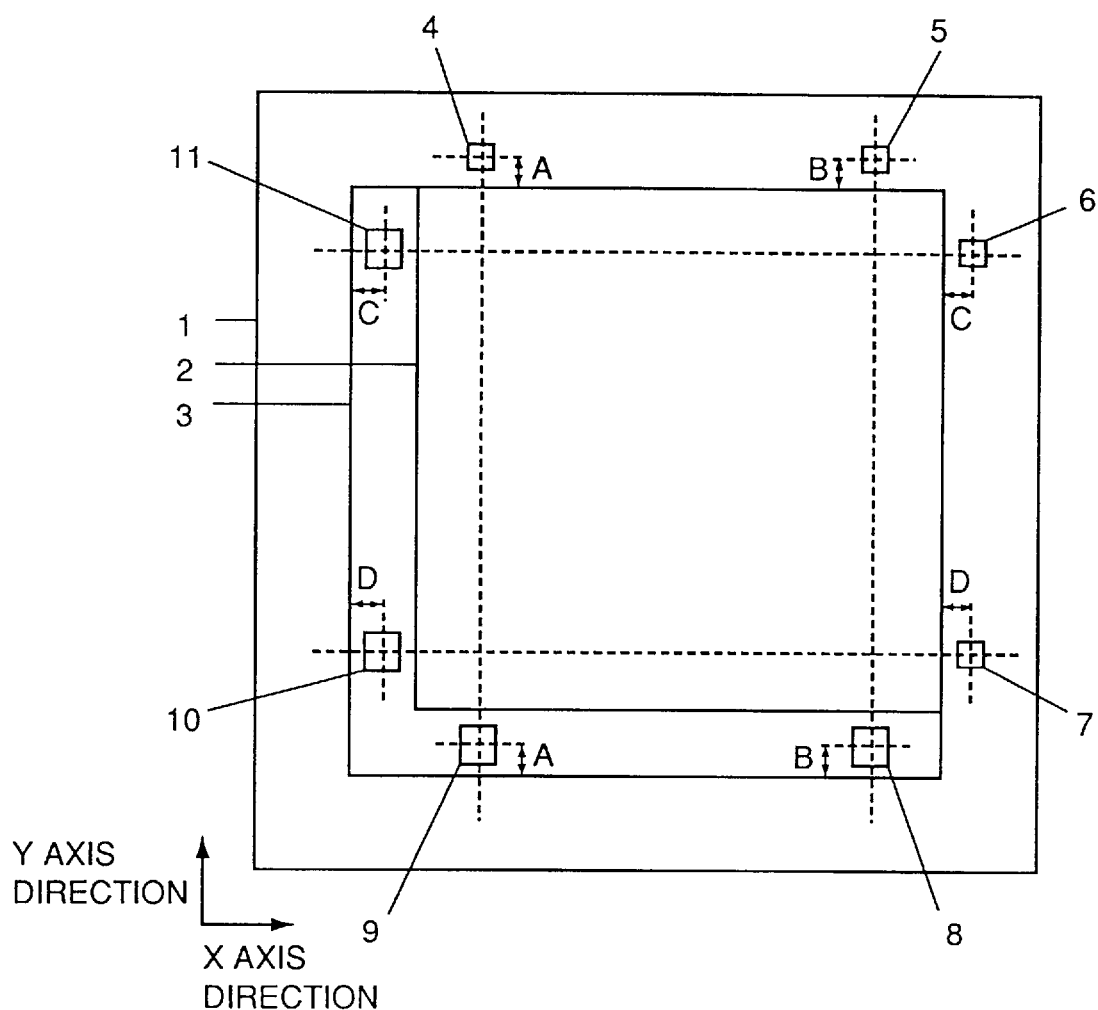
FIG. 1 is a plan view showing a reticle according to a first embodiment of the present invention.

Referring to FIG. 1, according to a reticle of a first embodiment of the present invention, a chip region (chip pattern) 2 is formed at a predetermined region on a main surface of a transparent substrate 1. A dicing line pattern 3 is formed along the outer perimeter of chip region 2 in an X axis direction and an Y axis direction indicated in the drawing. First measurement patterns 8 and 9 with a predetermined distance therebetween are formed on a region of dicing line pattern 3 in the X axis direction. A second measurement pattern 5 is arranged on a line of extension of first measurement pattern 8 in the Y axis direction so as to sandwich chip region 2 with first measurement pattern 8. Similarly, a second measurement pattern 4 is formed corresponding to first measurement pattern 9.

Third measurement patterns 10 and 11 are formed with a predetermined distance therebetween on a region of dicing line pattern 3 in the Y axis direction. A fourth measurement pattern 7 is formed on a line of the extension of third measurement pattern in the X axis direction with chip region 2 therebetween. Similarly, a fourth measurement pattern 6 is formed corresponding to third measurement pattern 11.

Arrangement is provided so that the distance B from the center of gravity of first measurement pattern 8 to the perimeter of dicing line pattern 3 is substantially equal to the distance B from the center of gravity of second measurement pattern 5 to the perimeter of chip region 2. Similarly, the distance A from the center of gravity of a first measurement pattern 9 to the perimeter of dicing line pattern 3 is set substantially equal to the distance A from the center of gravity of second measurement pattern 4 to the perimeter of chip region 2. Also, the distance D from the center of gravity of third measurement pattern 10 to the perimeter of dicing line pattern 3 is substantially equal to distance D from the center of gravity of fourth measurement pattern 7 to the perimeter of chip region 2. Similarly, distance C of third measurement pattern 11 is set substantially equal to distance C of fourth measurement pattern 6.

First measurement patterns 8 and 9 and second measurement patterns 4 and 5 are formed of substantially the same configuration. First measurement patterns 8 and 9 are formed greater in size than second measurement patterns 4 and 5. The size relationship between first measurement patterns 8 and 9 and second measurement patterns 4 and 5 may be opposite. Similarly, third measurement patterns 10 and 11 and fourth measurement patterns 6 and 7 are formed having similar shapes. Also, third measurement patterns 10 and 11 are formed greater in size than fourth measurement patterns 6 and 7. The size relationship thereof may be opposite.

Figure 2:
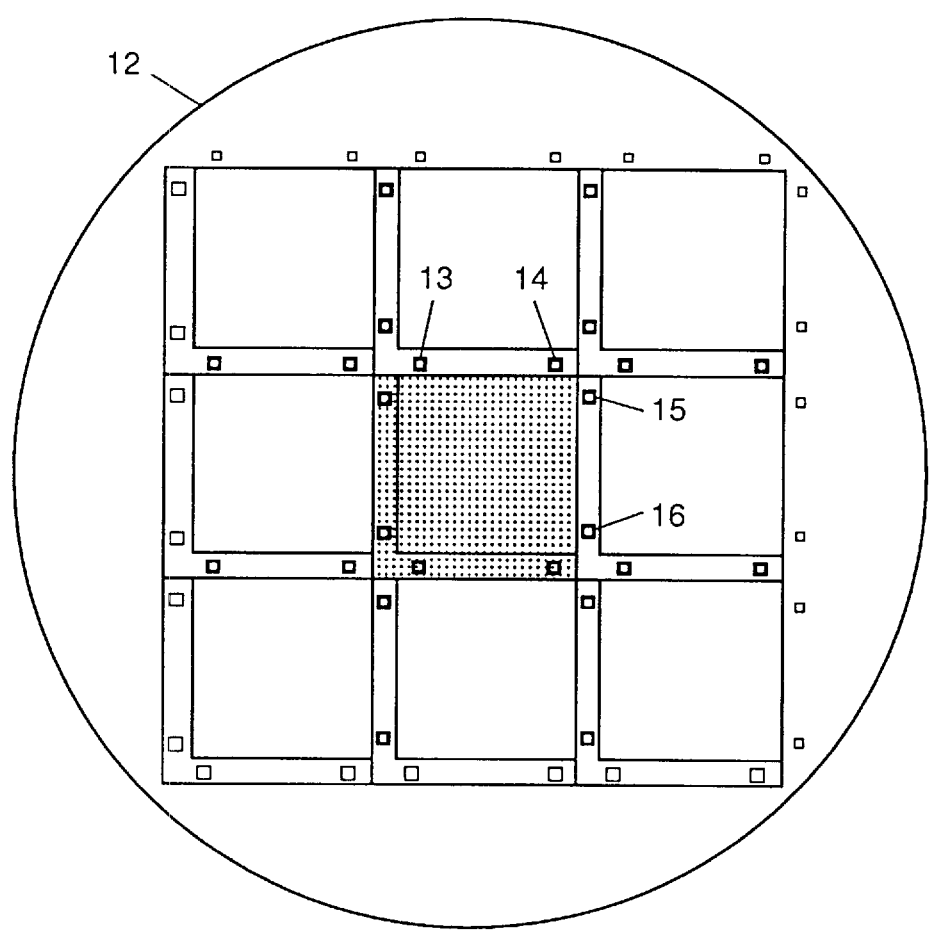
FIG. 2 is a plan view of a semiconductor wafer on which a pattern is transferred using the reticle of FIG. 1.

A wafer exposed and developed using the reticle of FIG. 1 is shown in FIG. 2. Referring to FIG. 2, measurement patterns 13, 14, 15, and 16 are formed at the crossing portions of adjacent shots (dicing line pattern region) on the main surface of a wafer 12. In measurement pattern 13, first measurement pattern 9 and second measurement pattern 4 shown in FIG. 1 are formed completely overlapping each other. Measurement pattern 14 is formed having first measurement pattern 8 and second measurement pattern 5 completely overlapping each other therein. Also, measurement pattern 15 of FIG. 2 is formed having third measurement pattern 11 and fourth measurement pattern 6 of FIG. 1 completely overlapping each other therein. Measurement pattern 16 is formed having third measurement pattern 10 and fourth measurement pattern 7 shown in FIG. 1 completely overlapping each other.

Since the measurement patterns of adjacent chips completely overlap each other, the area for the measurement pattern can be reduced to allow increase in the area for the chip region. As a result, the exposure region of the stepper can be effectively used. Particularly, the exposure region of the stepper can be increased to its maximum by reducing the size of measurement patterns 13, 14, 15 and 16.

When the measurement pattern as shown in FIG. 2 is formed using the reticle of FIG. 1, deviation in magnification and rotation of the exposure area can be detected just by wafer 12 subjected to exposure and development without requiring a conventional underlying pattern. Accordingly, deviation in magnification and rotation in the exposure region can be gauged even in the first exposure process (first step). As a result, deviation in the exposure condition of the first step can be suppressed. Furthermore, the exposure condition of the first step between the plurality of steppers can be made uniform. Thus, the overlay accuracy in steps subsequent to the first step can be improved.

Figure 3:
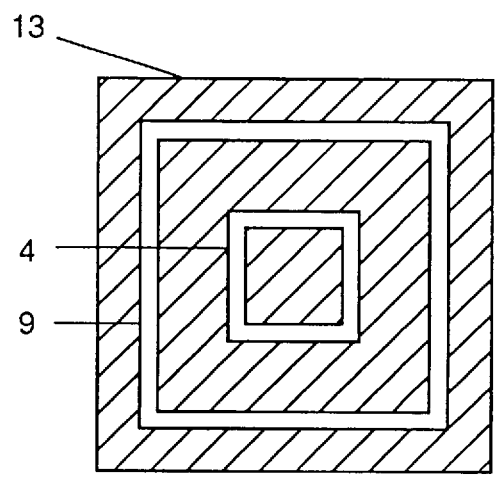
FIG. 3 is an enlarged view of a measurement pattern 13 of FIG. 2.

FIG. 3 is a plan view for describing the details of measurement pattern 13 of FIG. 2. Referring to FIG. 3, measurement pattern 13 includes first measurement pattern 9 and second measurement pattern 4 shown in FIG. 1. First and second measurement patterns 9 and 4 have a rectangular shape surrounded by a line of a groove (concave) configuration.

Figure 4:
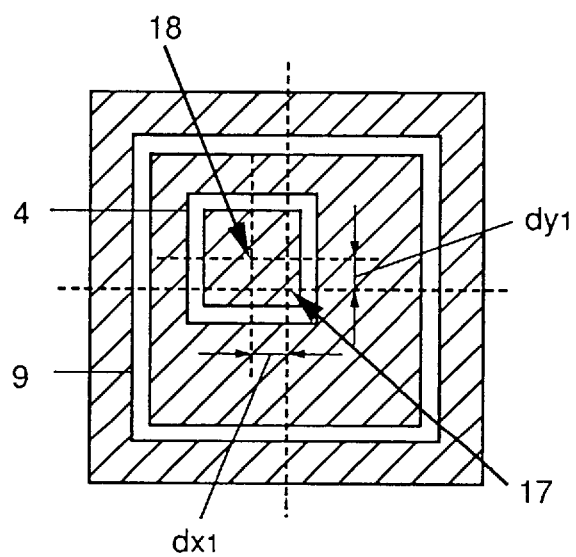
FIG. 4 is a plan view of the semiconductor wafer of FIG. 2 including variation in chip rotation or chip magnification.

The chip rotation and the chip magnification is gauged according to the amount of deviation between the center of gravity of first measurement pattern 9 and the center of gravity of second measurement pattern 4. This measurement is carried out using an appropriate detection device such as an overlay inspection device, an optical microscope, and the like. The overlay detection device is particularly advantageous in that gauging and calculation of a correction value can be carried out that will be described afterwards at high accuracy and also automatically. FIG. 4 shows the offset of the pattern when there is variation in chip rotation and chip magnification. Referring to FIG. 4, deviation in chip rotation and chip magnification is reflected as position offset of second measurement pattern 4 with respect to first measurement pattern 9. This amount of pattern deviation can be gauged quantitatively as distances $dx_1$ and $dy_1$ from the center of gravity 17 of first measurement pattern 9 to the center of gravity 18 of second measurement pattern 4 with the center of gravity 17 of first measurement pattern 9 as the reference. An overlay detection device is used for the measurement.

Figure 5:
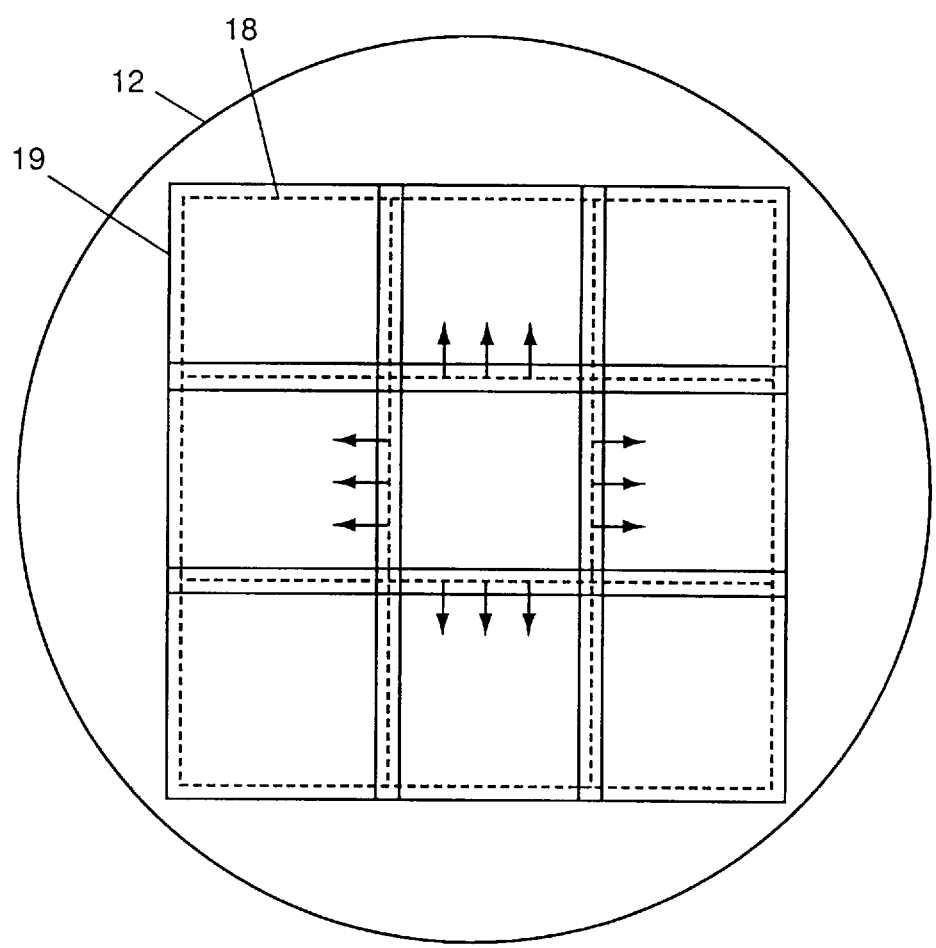
FIG. 5 is a plan view of the semiconductor wafer of FIG. 2 including variation in expanded chip magnification.

FIG. 5 shows an expanded chip magnification in wafer 12 of FIG. 2. Referring to FIG. 5, it is appreciated that the size of the original shot 18 is smaller than the actual shot 19 in which expansion occurs. Referring to FIGS. 2 and 5, the amount of deviation is reflected only in the X axis direction of measurement patterns 15 and 16 on the dicing line patterns in the vertical direction (Y axis direction), and in the Y axis direction of measurement patterns 13 and 14 on dicing line pattern 3 in the lateral direction (X axis direction). When expansion occurs, the amount of deviation in the X axis direction ($dx_1$) of measurement patterns 15 and 16, and also the amount of deviation in the Y axis direction ($dy_1$) of measurement patterns 13 and 14 take plus values. The amount of deviation values $dx_1$ and $dy_1$ are defined by the following equations (1) and (2), respectively.

$$dx_1 = 2 \times H \times x |H_1(t)| \qquad (1)$$

$$dy_1 = 2 \times P \times |y_1(t)| \qquad (2)$$

$X_1(t)$: X coordinate of each measurement pattern when center of chip region is (0, 0)

$Y_1(t)$: Y coordinate of each measurement pattern when center of chip region is (0, 0)

H: chip magnification in X axis direction [ppm]

P: chip magnification in Y axis direction [ppm]

(1 ppm of chip magnification is defined as corresponding to 0.02 μm of a shot end of 20 mm square in each shot on wafer.)

The values of $dx_1$, $dy_1$, $X_1(t)$ and $Y_1(t)$ of equations (1) and (2) can be gauged using an overlay detection device. Chip magnification values P and H can be calculated by the following equations (3) and (4).

$$H = \frac{2 \times |X_1(t)|}{dx_1} \qquad (3)$$

$$P = \frac{2 \times |Y_1(t)|}{dy_1} \qquad (4)$$

A more accurate value of chip magnification P and H can be obtained by calculating chip magnification values P and H for each pattern at corresponding portions of a plurality of shots on a wafer and taking an average value thereof.

Figure 6:
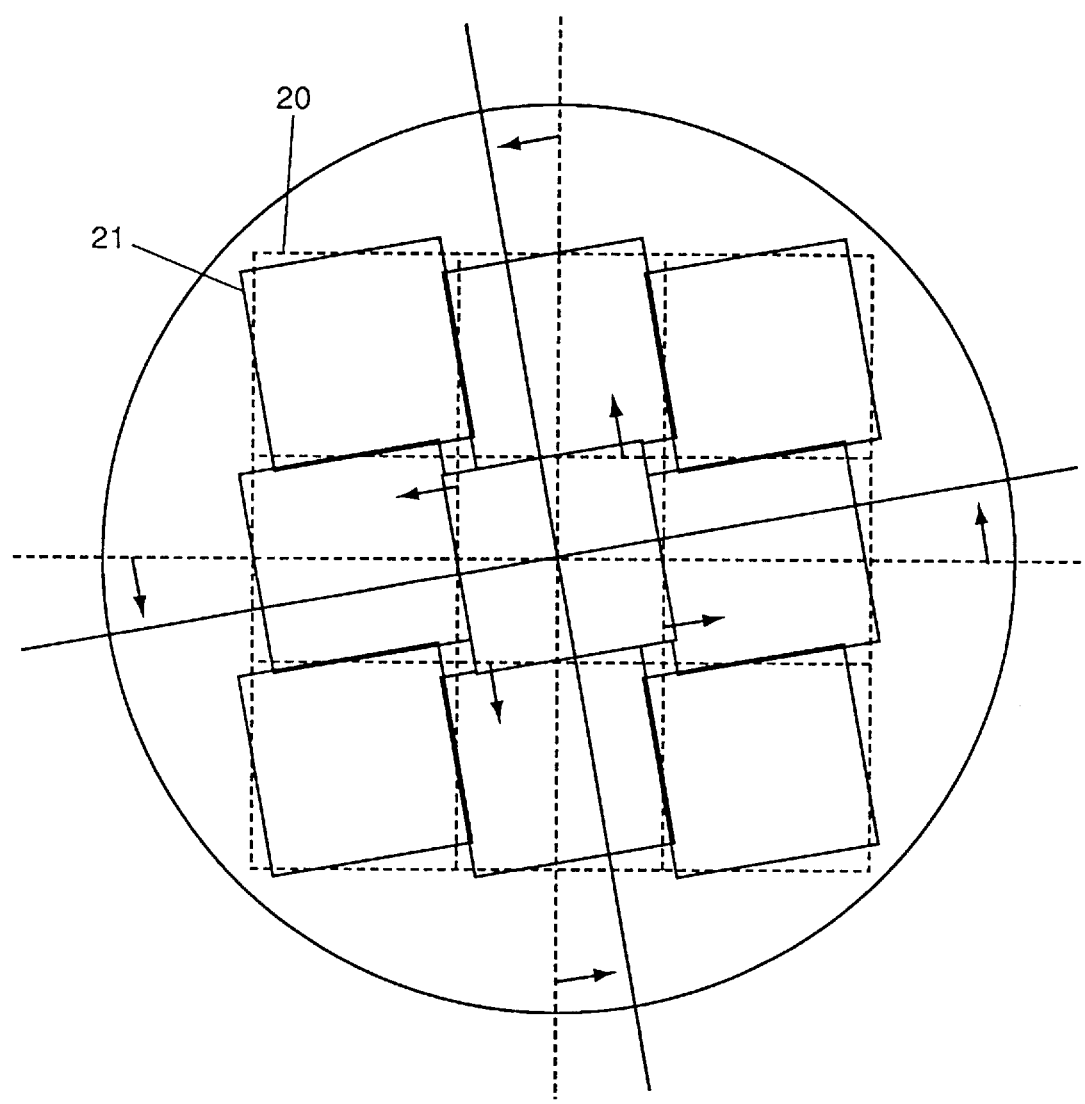
FIG. 6 is a plan view of the semiconductor wafer of FIG. 2 having leftwards chip rotation.

FIG. 6 shows the wafer of FIG. 2 with leftward chip rotation. It is appreciated from FIG. 6 that a shot 21 is positioned deviated by a predetermined angle from the original shot 20. Referring to FIGS. 2 and 6, the amount of position deviation arising from rotation is reflected only in the X axis direction of measurement patterns 13 and 14 on dicing line pattern 3 in the lateral direction (X axis direction), and in the Y axis direction of measurement patterns 15 and 16 on dicing line pattern 3 in the vertical direction (Y axis direction). In the case of leftwards rotation, the amount of deviation in the X axis direction $dx_2$ of measurement patterns 13 and 14 takes a plus value, and the amount of deviation in the Y axis direction $dy_2$ of measurement patterns 15 and 16 take a minus value.

Figure 7:
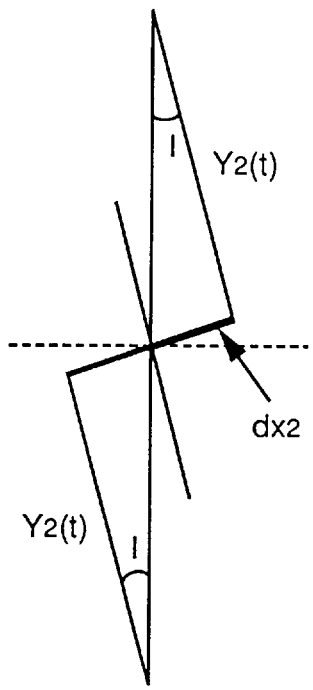
FIG. 7 is a schematic diagram for describing a deviation amount $dx_2$ in the X axis direction of FIG. 6.
Figure 8:
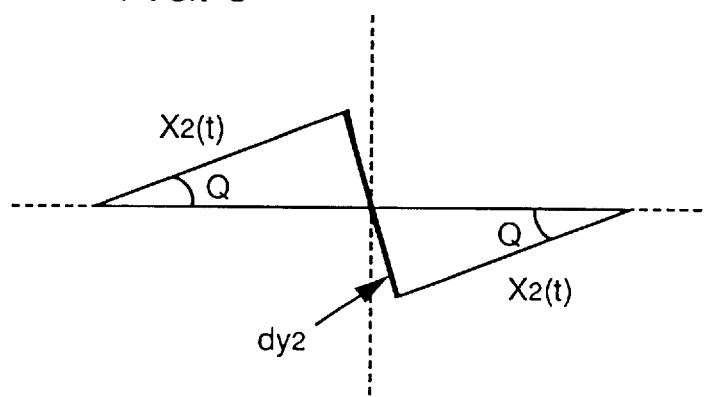
FIG. 8 is a schematic diagram for describing a deviation amount $dy_2$ in the Y axis direction of FIG. 6.

FIGS. 7 and 8 show the amount of deviation $dx_2$ in the X axis direction and the amount of deviation $dy_2$ in the Y axis direction, respectively, of FIG. 6. Amount of deviation $dx_2$ and $dy_2$ can be indicated by the following equations (5) and (6).

$$dx_2 = -2 \times \tan I \times Y_2(t) \quad (5)$$

$$dy_2 = 2 \times \tan Q \times |Y_2(t)| \quad (6)$$

$X_2(t)$: X coordinate of each measurement pattern when center of chip region is (0, 0)

$Y_2(t)$: Y coordinate of each measurement pattern when center of chip region is (0, 0)

I: chip rotation viewed from lateral dicing line [$\mu$rad]

Q: chip rotation viewed from vertical dicing line [$\mu$rad] (1 $\mu$rad of chip rotation is defined as corresponding to 0.02 $\mu$m at the shot end of a 20 mm square in each shot on wafer.)

The values of $dx_2$, $dy_2$, $X_2(t)$ and $Y_2(t)$ of equations (5) and (6) can be gauged using an overlay detection device. Chip rotation values I and Q can be calculated by the following equations (7) and (8).

$$\tan I = -\frac{dx_2}{(2 \times |Y_2(t)|)} \quad (7)$$

$$\tan Q = \frac{dy_2}{(2 \times |Y_2(t)|)} \quad (8)$$

A more accurate value of chip rotation I and Q can be obtained by calculating chip rotation I and Q for each pattern in corresponding portions of the plurality of shots on a wafer and taking an average value thereof.

The difference in chip rotation I and chip rotation Q calculated by equations (5) and (6) indicates the deviation in the orthogonality of the chip. Therefore, the orthogonality of the chip can be corrected by calculating difference between chip rotation I and Q with the dicing line in the X axis direction (lateral direction) or in the Y axis direction (vertical direction) as the reference and apply the calculated difference as orthogonality correction value at the time of exposure.

The above measurement is carried out at a constant frequency. Also, chip rotation values I and Q and chip magnification values H and P are calculated individually from the measured values. The calculated chip rotation values I and Q and chip magnification values H and P are used as chip rotation correction values and chip magnification correction values, and further as chip orthogonality correction values in a subsequent exposure step of a wafer or a lot. Accordingly, the exposure condition of the first step can always be set identical. Thus, variation in the exposure condition of the first step can be suppressed.

Figure 9:
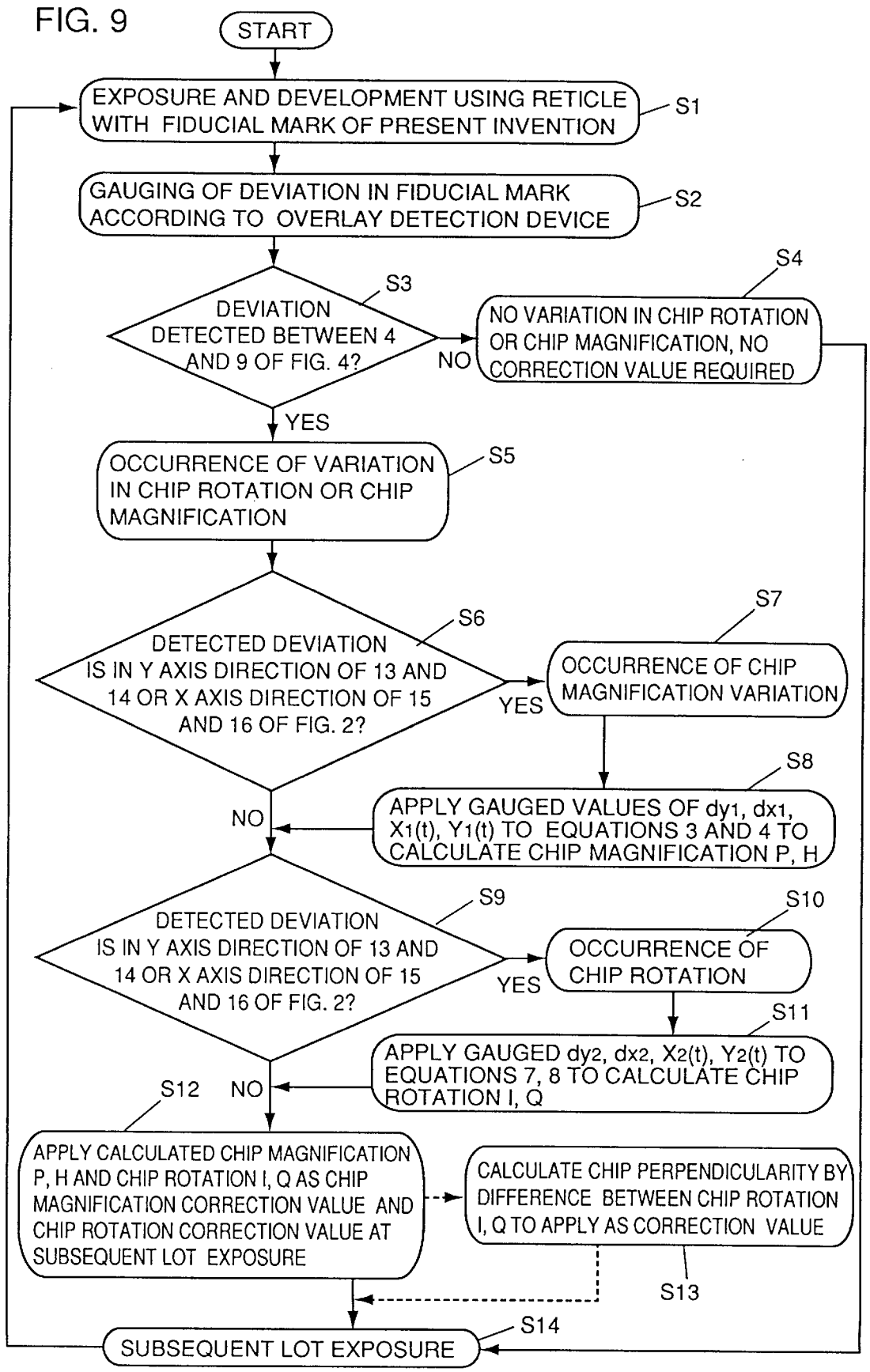
FIG. 9 is a flow chart for describing a method of correcting overlay error according to the present invention.

FIG. 9 is a flow chart of a correction method using the reticle of the first embodiment shown in FIG. 2. At step S1, exposure and development are carried out using the reticle with the fiducial mark of the present invention shown in FIG. 2. At S2, deviation in the mark position is gauged using an overlay detection device. At step 3, determination is made whether deviation is detected between first measurement pattern 9 and second measurement pattern 4 of FIG. 4. When no deviation is detected, determination is made that there is no variation in the chip rotation and the chip magnification at S4. Determination is made that no correction value is required. Control proceeds to exposure of a subsequent lot of step S14.

When deviation between first measurement pattern 9 and second measurement pattern 4 is detected at step S3, control proceeds to step S5 where determination is made of generation of variation in chip rotation or chip magnification. At S6, determination is made whether the detected deviation is in the X axis direction of measurement patterns 13 and 14 or in the X axis direction of measurement patterns 15 and 16 in FIG. 2.

When the detected deviation is in the Y axis direction of measurement patterns 13 and 14 or in the X axis direction of measurement patterns 15 and 16, control proceeds to S7 where determination is made that there is variation in chip magnification. In this case, control proceeds to S8 where the gauged amount of deviation in the X axis direction $dx_1$, the amount of deviation in the Y axis direction $dy_1$, the measurement pattern X coordinate $X_1(t)$ and the measurement pattern Y coordinate $Y_1(t)$ are applied to the aforementioned equations (3) and (4) to calculate chip magnification values P and H. Then, control proceeds to the step of S9.

When determination is made that the detected deviation is not in the Y axis direction of measurement patterns 13 and 14 or in the X axis direction of measurement patterns 15 and 16 in S6, control proceeds to S9. At S9, determination is made whether the detected deviation is in the Y axis direction of measurement patterns 13 and 14 or in the X axis direction of measurement patterns 15 and 16. When such a deviation is detected, generation of a chip rotation is determined at S10. Then at S11, the amount of deviation $dx_2$ in the X axis direction of measurement patterns 13 and 14, the amount of deviation $dy_2$ in the Y axis direction of measurement patterns 15 and 16, the measurement pattern X coordinate $X_2(t)$ and the measurement pattern Y coordinate $Y_2(t)$ are applied to equations (7) and (8) to calculate chip rotation values I and Q. Then control proceeds to S10.

When determination is made at S9 that no deviation is detected in the Y axis direction of measurement patterns 13 and 14 and in the X axis direction of measurement patterns 15 and 16, control proceeds to the step of S12. At S12, the calculated chip magnification values P and H and chip rotation values I and Q are applied as chip magnification correction values and chip rotation correction values for a subsequent exposure of a lot. Additionally, at S13, the chip orthogonality is calculated according to the difference between chip rotation values I and Q. The calculated value is applied to the exposure device as a correction value. Then, control proceeds to S14 to carry out a subsequent exposure of a lot.

Second Embodiment

Figure 10:
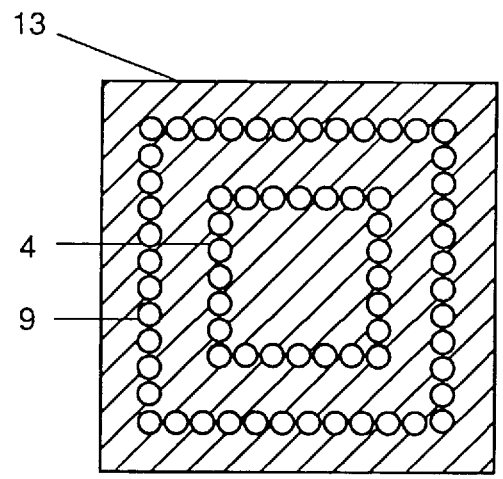
FIG. 10 is a plan view showing an example of a measurement pattern according to a second embodiment of the present invention.
Figure 11:
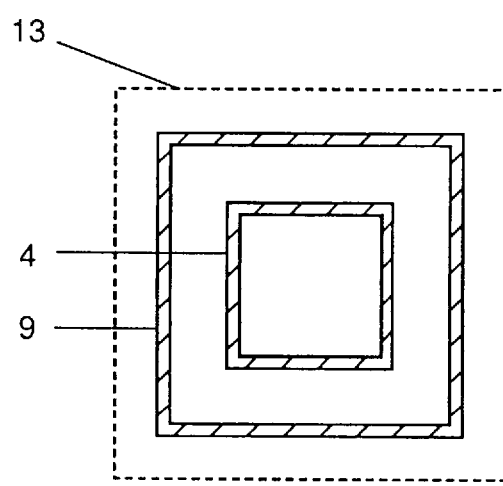
FIG. 11 is a plan view showing another example of a measurement pattern according to the second embodiment of the present invention.
Figure 12:
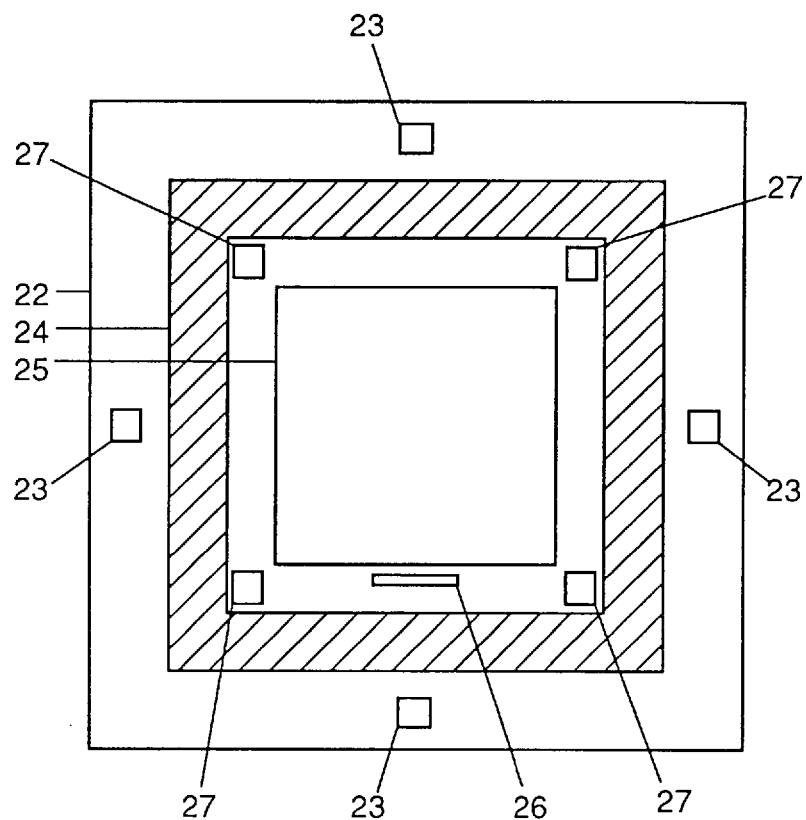
FIG. 12 is a plan view showing a conventional reticle.
Figure 13:
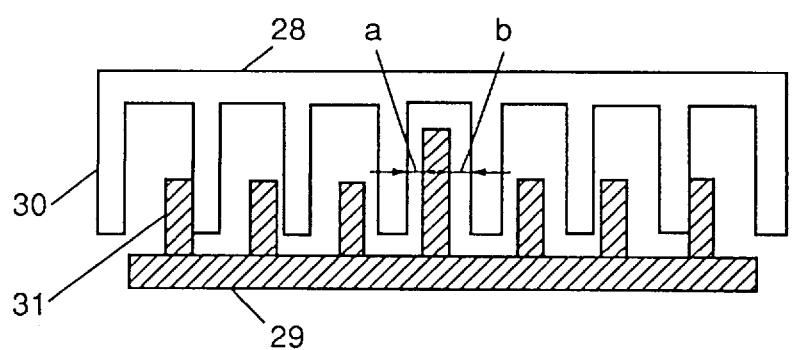
FIG. 13 is a plan view showing a fiducial mark (measurement pattern) formed using the conventional reticle shown in FIG. 12.

According to a second embodiment of the present invention, a measurement pattern is formed according to a configuration and a formation method approximating those of the chip pattern of interest. More specifically, in the step where the chip pattern (chip region 2) is mainly formed of a hole (opening), first measurement pattern 9 and second measurement pattern 4 are formed by a plurality of openings as shown in FIG. 10. In the case where chip pattern 2 is formed mainly of a convex line, first and second measurement patterns 9 and 4 are formed by a convex line as shown in FIG. 11. Measurement pattern 13 is formed of such first and second measurement patterns 9 and 4. Remaining measurement patterns 14, 15 and 16 shown in FIG. 2 are formed in a manner similar to that of the above-described measurement pattern 13.

By forming measurement patterns 13–16 in a configuration approximating that of chip pattern 2 of interest, exposure and development characteristics of chip region 2 can be approximated to those of measurement patterns 13–16. As a result, the effect of aberration upon measurement patterns 13–16 can be approximated to the effect of aberration on chip region 2 to allow gauging of overlay deviation at a higher precision. By forming the measurement pattern with the opening diameter and line width mainly use in chip region 2, the accuracy can further be improved. The method of measurement is identical to that of the first embodiment.

Third Embodiment

In contrast to the first embodiment in which the measurement pattern is applied to the first exposure process (first step), the measurement pattern according to the third embodiment of the present invention is applied to a step subsequent to the first step. Generally at a step subsequent to the first step, exposure and development is carried out after an underlying pattern is formed at a previous step to form a measurement pattern above the underlying pattern. Then, deviation between the measurement pattern and the underlying pattern is gauged. In this case, it is difficult to provide variation in chip rotation, chip magnification, and chip orthogonality originating from the wafer and variation in chip rotation, chip magnification, and chip orthogonality originating from the stepper independently.

In the present third embodiment, a measurement pattern according to the present invention and a conventional measurement pattern using an underlying pattern are used simultaneously at steps subsequent to the first step. More specifically, a general overlay detection is carried out by a measurement pattern using an underlying pattern, and a measurement operation similar to that of the first embodiment is carried out according to the measurement pattern of the present invention. As a result, it is possible to extract components originating from the stepper from the chip rotation deviation, chip magnification deviation, and chip orthogonality deviation. Overlay deviation can be corrected at a higher level than by conventional art. In this case, it is desirable to form the measurement pattern of a type identical to that of chip pattern 2 as described in the second embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A reticle used in an exposure step of a semiconductor wafer, comprising:

a transparent substrate including a main surface, a chip pattern formed on the main surface of said transparent substrate, a dicing line pattern formed on the main surface of said transparent substrate along a perimeter of said chip pattern in an X axis direction and in an Y axis direction, a first measurement pattern formed, at least one in number, on said dicing line pattern in the X axis direction, a second measurement pattern formed on a line of extension of said first measurement pattern in the Y axis direction so as to sandwich said chip pattern with said first measurement pattern, a third measurement pattern formed, at least one in number, on said dicing line pattern in the Y axis direction, and a fourth measurement pattern formed on a line of extension of said third measurement pattern in the X axis direction so as to sandwich said chip pattern with said third measurement pattern, wherein a distance in the Y axis direction from the perimeter of said dicing line pattern in the X axis direction to the center of gravity of said first measurement pattern is substantially equal to a distance in said Y axis direction from a perimeter of said chip pattern in the X axis direction to the center of gravity of said second measurement pattern, wherein a distance in the X axis direction from the perimeter of said dicing line pattern in the Y axis direction to the center of gravity of said third measurement pattern is substantially equal to a distance in the X axis direction from a perimeter of said chip pattern in the Y axis direction to the center of gravity of said fourth measurement pattern.

2. The reticle according to claim 1, wherein said first, second, third and fourth measurement patterns include a pattern of a type identical to the type of said chip pattern.

3. The reticle according to claim 2, wherein said first, second, third and fourth measurement patterns are formed in a concave manner.

4. The reticle according to claim 2, wherein said first, second, third, and fourth measurement patterns are formed by a plurality of openings.

5. The reticle according to claim 2, wherein said first, second, third and fourth measurement patterns are formed in a convex manner.

6. The reticle according to claim 1, wherein said first and second measurement patterns have substantially a same configuration, and one of said first and second measurement patterns is greater in size than the other, wherein said third and fourth measurement patterns have substantially a same configuration, and one of said third and fourth measurement patterns is greater in size than the other.

7. A pattern transferred on a semiconductor wafer using a reticle, comprising:

a chip pattern formed on a main surface of said semiconductor wafer, a dicing line pattern formed along a perimeter of said chip pattern in an X axis direction and an Y axis direction, a first measurement pattern formed, at least one in number, on said dicing line pattern in the X axis direction, a second measurement pattern formed within a region of said first measurement pattern so as to overlap said first measurement pattern, and smaller in size than said first measurement pattern, a third measurement pattern formed, at least one in number, on said dicing line pattern of the Y axis direction, and a fourth measurement pattern formed within a region of said third measurement pattern so as to overlap said third measurement pattern, and smaller in size than said third measurement pattern.

8. The pattern according to claim 7, wherein said first, second, third, and fourth measurement patterns includes a pattern of a type identical to the type of said chip pattern.

9. The pattern according to claim 8, wherein said first, second, third, and fourth measurement patterns are formed in a concave manner.

10. The pattern according to claim 8, wherein said first, second, third and fourth measurement patterns are formed by a plurality of openings.

11. The pattern according to claim 8, wherein said first, second, third and fourth measurement patterns are formed in a convex manner.

12. A correction method using a reticle including a chip pattern formed on a main surface of a transparent substrate, a dicing line pattern formed on the main surface of said transparent substrate along a perimeter of said chip pattern in an X axis direction and an Y axis direction, at least one first measurement pattern formed on said dicing line pattern in the X axis direction, a second measurement pattern formed on a line of extension of said first measurement pattern in the Y axis direction so as to sandwich said chip pattern with said first measurement pattern, at least one third measurement pattern formed on said dicing line pattern in the Y axis direction, and a fourth measurement pattern formed on a line of extension of said third measurement pattern in the X axis direction so as to sandwich said chip pattern with said third measurement pattern, said correction method comprising the steps of:

a step of transferring said chip pattern, said dicing line pattern, said first, second, third and fourth measurement patterns on a semiconductor wafer by carrying out exposure and development using said reticle, a step of gauging an amount of deviation between said transferred first measurement pattern and said transferred second measurement pattern, and an amount of deviation between said transferred third measurement pattern and said transferred fourth measurement pattern using an overlay detection device, a step of calculating at least one of an amount of deviation in chip magnification and an amount of deviation in chip rotation according to said gauged amount of deviation, and a step of applying an amount of deviation in chip magnification, when calculated, at a subsequent exposure as a chip magnification correction value, and applying an amount of deviation in chip rotation, when calculated, at a subsequent exposure as a chip rotation correction value.

13. The correction method according to claim 12, further comprising:

a step of calculating an amount of deviation in chip orthogonality according to an amount of deviation in chip rotation when said amount of deviation chip rotation is calculated, and a step of applying said amount of deviation in chip orthogonality as a chip orthogonality deviation correction value at a subsequent exposure.

* * * * *

UNITED STATES PATENT AND TRADEMARK OFFICE
CERTIFICATE OF CORRECTION

PATENT NO. : 5,868,560
DATED : February 9, 1999
INVENTOR(S) : Naohisa Tamada et al.

It is certified that error appears in the above-identified patent and that said Letters Patent is hereby corrected as shown below:

<u>Column 8,</u>
Line 37, Equation (1), change "$dx_1 = 2xHxx | H_1(t) |$" to -- $dx_1 = 2xHx | X_1(t) |$ --

<u>Column 9,</u>
Line 9, change "13 and 14 takes a plus value" to -- 13 and 14 take a minus value --;
Line 11, change "minus" to -- plus --;
Line 19, change equation (5) from "$dx_2 = -2x\tan Ix Y_2(t)$" to -- $dx_2 = -2x\tan Ix | Y_2(t) |$ --

Signed and Sealed this

Twentieth Day of May, 2003

JAMES E. ROGAN
*Director of the United States Patent and Trademark Office*